(12) United States Patent
Lill et al.

(10) Patent No.: US 9,818,633 B2
(45) Date of Patent: Nov. 14, 2017

(54) EQUIPMENT FRONT END MODULE FOR TRANSFERRING WAFERS AND METHOD OF TRANSFERRING WAFERS

(71) Applicant: Lam Research Corporation, Fremont, CA (US)

(72) Inventors: Thorsten Lill, Santa Clara, CA (US); Vahid Vahedi, Oakland, CA (US); Candi Kristoffersen, San Jose, CA (US); Andrew D. Bailey, III, Pleasanton, CA (US); Meihua Shen, Fremont, CA (US); Rangesh Raghavan, Fremont, CA (US); Gary Bultman, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 455 days.

(21) Appl. No.: 14/517,623

(22) Filed: Oct. 17, 2014

(65) Prior Publication Data
US 2016/0111309 A1 Apr. 21, 2016

(51) Int. Cl.
*H01L 21/677* (2006.01)

(52) U.S. Cl.
CPC .. *H01L 21/67745* (2013.01); *H01L 21/67766* (2013.01)

(58) Field of Classification Search
CPC ......... H01L 21/67775; H01L 21/67778; H01L 21/67748
USPC ........................................ 414/217, 937, 939
See application file for complete search history.

(56) References Cited

U.S. PATENT DOCUMENTS

| | | | |
|---|---|---|---|
| 4,917,556 A | 4/1990 | Stark et al. | |
| 6,321,134 B1 | 11/2001 | Henley et al. | |
| 6,503,365 B1 * | 1/2003 | Kim | H01L 21/67161 118/719 |
| 6,543,981 B1 | 4/2003 | Halsey et al. | |
| 6,852,194 B2 * | 2/2005 | Matsushita | C23C 16/54 118/719 |
| 7,278,812 B2 * | 10/2007 | Mizokawa | H01L 21/67173 414/217 |
| 7,309,618 B2 | 12/2007 | Gotkis et al. | |
| 7,536,538 B1 | 5/2009 | Huang et al. | |
| 7,560,007 B2 | 7/2009 | Gaff | |
| 7,604,449 B1 | 10/2009 | Kaveh | |
| 7,680,559 B2 | 3/2010 | Thorgrimsson | |

(Continued)

FOREIGN PATENT DOCUMENTS

EP          1684951 B1    5/2014

*Primary Examiner* — Jonathan Snelting

(57) ABSTRACT

An EFEM useful for transferring wafers to and from wafer processing modules comprises an enclosure having a controlled environment therein bounded by a front wall, a back wall, first and second side walls, a top wall, and a bottom wall. The first side wall and the second side wall include two or more wafer load ports wherein each wafer load port is adapted to receive a FOUP. The front wall includes wafer ports configured to attach to respective load locks operable to allow a wafer to be transferred to a front wall cluster processing tool. The back wall includes a wafer port adapted to be in operational relationship with a back wall cluster processing tool. A robot in the EFEM enclosure is operable to transfer wafers through the wafer load ports, the first front wall wafer port, the second front wall wafer port, and the back wall wafer port.

19 Claims, 8 Drawing Sheets

(56) References Cited

U.S. PATENT DOCUMENTS

| | | |
|---|---|---|
| 7,682,462 B2 | 3/2010 | Kroeker |
| 7,798,388 B2 | 9/2010 | Crockett et al. |
| 8,033,769 B2 | 10/2011 | Gage et al. |
| 8,185,242 B2 | 5/2012 | Wong et al. |
| 8,197,177 B2 | 6/2012 | van der Meulen et al. |
| 8,225,683 B2 | 7/2012 | Bailey, III |
| 8,272,826 B2 * | 9/2012 | Jo ................... H01L 21/67161 414/217 |
| 8,282,698 B2 | 10/2012 | Lenz |
| 8,388,762 B2 | 3/2013 | Freer et al. |
| 8,430,620 B1 | 4/2013 | Blank |
| 8,616,821 B2 | 12/2013 | Ku et al. |
| 8,639,381 B2 | 1/2014 | Thorgrimsson |
| 8,757,177 B2 | 6/2014 | Kholodenko et al. |
| 8,851,817 B2 | 10/2014 | Bonora et al. |
| 9,147,592 B2 * | 9/2015 | Englhardt ......... H01L 21/67739 |
| 2008/0232934 A1 | 9/2008 | Price et al. |
| 2012/0328780 A1 | 12/2012 | Yamagishi |
| 2013/0230370 A1 | 9/2013 | Hoey et al. |
| 2014/0072397 A1 | 3/2014 | Mooring |
| 2014/0076234 A1 | 3/2014 | Kao et al. |
| 2014/0086720 A1 | 3/2014 | Kao et al. |
| 2014/0112743 A1 | 4/2014 | Morisawa |
| 2014/0119858 A1 | 5/2014 | Koike et al. |
| 2014/0161570 A1 | 6/2014 | Hofmeister et al. |
| 2014/0174354 A1 | 6/2014 | Arai |
| 2014/0178160 A1 | 6/2014 | Fosnight et al. |
| 2014/0199138 A1 | 7/2014 | van der Meulen et al. |

* cited by examiner

EQUIPMENT FRONT END MODULE FOR TRANSFERRING WAFERS AND METHOD OF TRANSFERRING WAFERS

FIELD OF THE INVENTION

This invention pertains to wafer processing systems, and may find particular use in equipment front end modules of wafer processing systems.

BACKGROUND

Different types of tools are used to perform hundreds of processing operations during processing of wafers (i.e. semiconductor substrates) in wafer processing systems. Most of these operations are performed in vacuum chambers (i.e., process chambers) of a wafer processing system at very low pressure. Other operations are performed at atmospheric pressure in controlled environments of filtered air or an inert gas. Wafers are introduced to the process chambers with wafer handling systems that are mechanically coupled to respective process chambers. The wafer handling systems transfer wafers from the factory floor to the process chamber. Wafer handling systems can include, for example, equipment front end modules (EFEMs) which are operable to transfer wafers from a front opening unified pod (FOUP) to the wafer processing system for processing and back to the FOUP, load locks to bring the wafers from atmospheric conditions to very low pressure conditions (e.g., vacuum conditions) and back to atmospheric conditions wherein robots transfer the wafers to various positions in the wafer processing system. Throughput (i.e., the number of wafers that are processed in a period of time) is affected by the wafer processing time, the number of wafers that are processed at a given time, as well as timing of the steps to introduce the wafers into the vacuum chambers. Thus, improved methods and apparatuses which increase throughput are needed.

SUMMARY

Disclosed herein is an equipment front end module (EFEM) useful for transferring semiconductor wafers to and from semiconductor wafer processing modules. The EFEM comprises an enclosure adapted to have a controlled environment therein wherein the enclosure is bounded by a front wall, a back wall, first and second side walls between the front wall and the back wall, a top wall, and a bottom wall. The first side wall, the second side wall, the top wall, or the bottom wall include two or more wafer load ports wherein each wafer load port is adapted to receive a front opening unified pod (FOUP) from an wafer transfer system configured to transfer a FOUP to a respective wafer load port. The front wall includes a first front wall wafer port and a second front wall wafer port. The first and second front wall wafer ports are configured to attach to respective first and second front wall load locks that are operable to allow a wafer to be transferred from the controlled environment of the EFEM to a vacuum environment of a front wall cluster processing tool or from the vacuum environment of the front wall cluster processing tool to the controlled environment of the EFEM. The back wall includes a first back wall wafer port adapted to be in operational relationship with a back wall cluster processing tool. At least one robot in the enclosure of the EFEM is operable to transfer wafers through the wafer load ports, the first front wall wafer port, the second front wall wafer port, and the back wall wafer port.

Also disclosed herein is an equipment front end module (EFEM) useful for transferring semiconductor wafers to and from processing modules. The EFEM comprises an enclosure adapted to have a controlled environment therein wherein the enclosure is bounded by a front wall, a back wall, first and second side walls between the front wall and the back wall, a top wall, and a bottom wall. The first side wall, the second side wall, the top wall, or the bottom wall includes two or more wafer load ports wherein each wafer load port is adapted to receive a front opening unified pod (FOUP) from a wafer transfer system configured to transfer a FOUP to a respective wafer load port. The front wall includes a first front wall wafer port and a second front wall wafer port. The first and second front wall wafer ports are configured to attach to respective first and second front wall load locks operable to allow a wafer to be transferred from the controlled environment of the EFEM to a vacuum environment of a front wall cluster processing tool or from the vacuum environment of the front wall cluster processing tool to the controlled environment of the EFEM. The first side wall includes at least two first side wall wafer ports and the second side wall includes at least two second side wall wafer ports wherein the at least two first side wall wafer ports and the at least two second side wall wafer ports each configured to attach to a respective semiconductor wafer processing module. At least one robot in the enclosure of the EFEM is operable to transfer wafers through the wafer load ports, the first front wall wafer port, the second front wall wafer port, the at least two first side wall wafer ports, and the at least two second side wall wafer ports.

DETAILED DESCRIPTION

Figure 1:
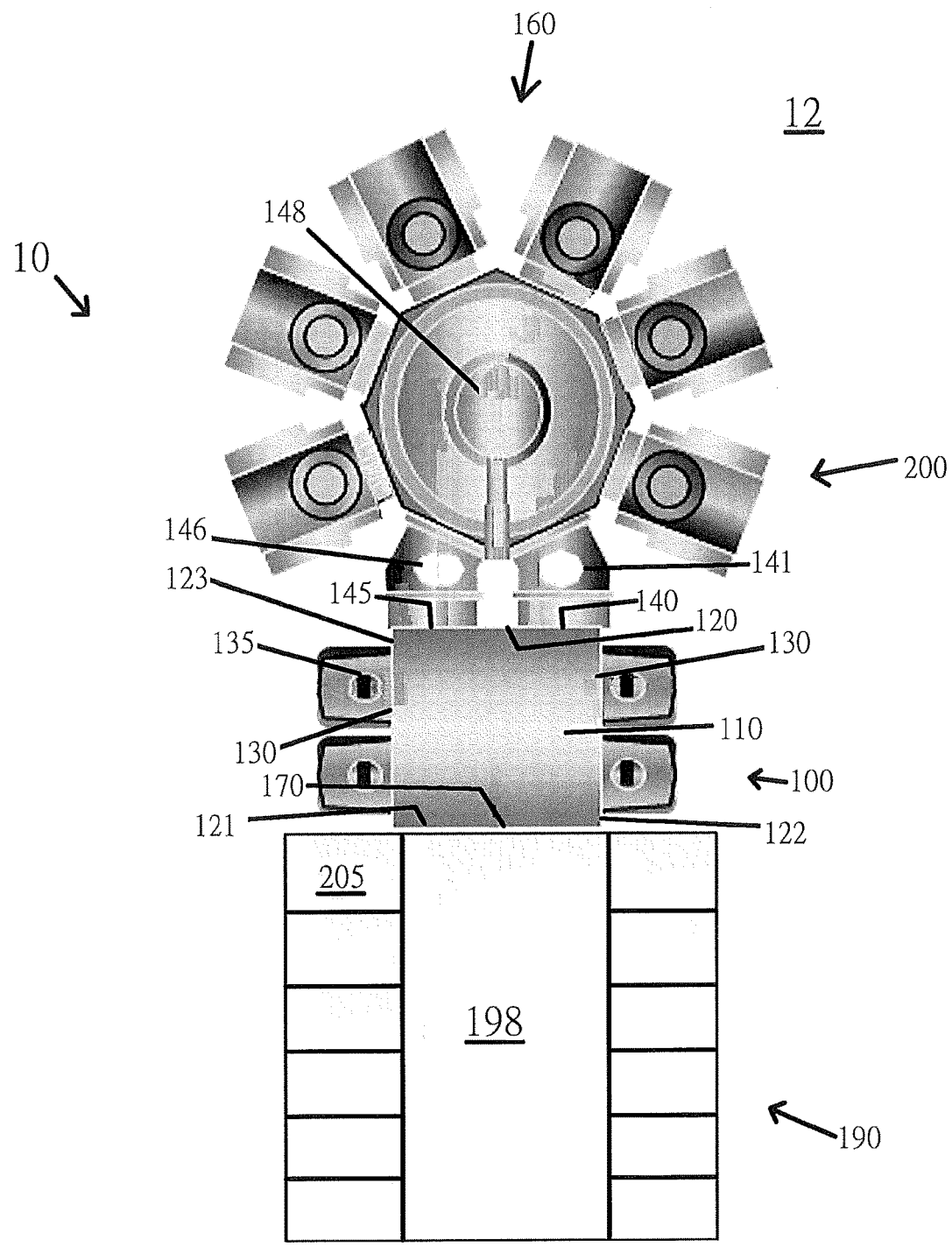
FIG. 1 shows a wafer processing system according to embodiments disclosed herein.

In the following detailed description, numerous specific embodiments are set forth in order to provide a thorough understanding of the systems, apparatuses, and methods disclosed herein. However, as will be apparent to those skilled in the art, that the present embodiments may be practiced without these specific details or by using alternate elements or processes. In other instances, well-known processes, procedures, and/or components have not been described in detail so as not to unnecessarily obscure aspects of embodiments disclosed herein. Like numerals in the figures indicate like elements. As used herein the term "about" refers to ±10%.

Present embodiments disclosed herein include wafer processing systems which include an equipment front end module (EFEM) useful for transferring semiconductor wafers to and from semiconductor wafer processing modules in operational relationship therewith. Referring to FIG.

1, according to embodiments disclosed herein, a semiconductor wafer (substrate) processing system 10 can be positioned in a clean room 12 wherein the atmosphere inside the wafer processing system 10 is controlled to minimize, if not prevent, exposure of a wafer to the ambient of the clean room 12 before, during, and after wafer processing. The wafer processing system 10 includes an EFEM 100. The EFEM 100 includes an enclosure 110 adapted to have a controlled environment therein wherein the enclosure 110 is bounded by a front wall 120, a back wall 121, a first side wall 122 extending between the front wall 120 and the back wall 121, a second side wall 123 extending between the front wall 120 and the back wall 121, a top wall (not shown), and a bottom wall (not shown). Controlled environments as disclosed herein can include environments of filtered air (e.g. ambient filtered air) or environments of an inert gas such as nitrogen wherein the controlled environment can be at atmospheric pressure or at a pressure greater or lesser than atmospheric pressure such as vacuum pressure.

The first side wall 122, the second side wall 123, the top wall, or the bottom wall can include two or more wafer load ports 130 wherein each wafer load port 130 is adapted to receive a front opening unified pod (FOUP) 135 from an overhead wafer transfer system (not shown) configured to transfer a FOUP 135 to a respective wafer load port 130. The FOUP 135 is a type of plastic enclosure designed to hold semiconductor wafers (e.g., generally silicon wafers (Si) but may also include various other wafer types formed from elemental semiconductor materials such as germanium (Ge), or compound semiconductor materials such as gallium-arsenide (GaAs) or indium arsenide (InAs)). The FOUP 135 holds the wafers (not shown) securely and safely in a controlled environment thereof. Each wafer load port 130 can include a respective FOUP 135 attached thereto, however each wafer load port 130 does not need to have a respective FOUP 135 attached thereto (i.e. only some of the wafer load ports 130 may include a respective FOUP 135 attached thereto). In an embodiment, the controlled environment of the EFEM 100 can be at vacuum pressure wherein the FOUP 135 attached to the wafer load port 130 is likewise under vacuum pressure.

As illustrated in FIG. 1, the first side wall 122 includes two wafer load ports 130 adapted to each receive a respective FOUP 135, and the second side wall 123 includes two wafer load ports 130 adapted to each receive a respective FOUP 135. The front wall 120 includes a first front wall wafer port 140 and a second front wall wafer port 145. The first and second front wall wafer ports 140, 145 can each attach to (i.e. interface with) respective first and second front wall load locks 141, 146 that are operable to allow a wafer to be transferred from the controlled environment of the EFEM 100 to a vacuum environment of a front wall vacuum transfer module 148 of a front wall cluster processing tool 160 or from the vacuum environment of the front wall vacuum transfer module 148 of the front wall cluster processing tool 160 to the controlled environment of the EFEM 100.

At least one robot (not shown) in the enclosure 110 of the EFEM 100 is operable to transfer wafers from a FOUP 135 attached to a respective wafer load port 130 to the first or second front wall load lock 141, 146. The first and/or second front wall load locks 141, 146 can include a vacuum pump (not shown) in fluid communication therewith such that the vacuum pump may reduce the pressure in the respective load lock 141, 146 so as to allow the wafer to be subsequently transferred to the front wall vacuum transfer module 148. A vacuum transfer robot (not shown) of the front wall vacuum transfer module 148 is operable to transfer the wafer from the respective first or second front wall load lock 141, 146 to one or more front wall processing modules 200 of the front wall cluster processing tool 160 wherein one or more process operations can be performed on the respective wafer.

After the one or more process operations have been performed on the wafer, the wafer may be transferred back through the first or second front wall load lock 141, 146 by the vacuum transfer robot of the front wall vacuum transfer module 148, wherein the pressure in the interior of the respective front wall load lock 141, 146 may be increased such that the at least one robot of the EFEM 100 may transfer the wafer from the respective first or second front wall load lock 141, 146 back to the controlled environment of the EFEM 100. In a preferred embodiment, the first front wall load lock 141 can be dedicated to transferring wafers from the controlled environment of the EFEM 100 to the vacuum environment of the front wall vacuum transfer module 148 while the second front wall load lock 146 is dedicated to transferring wafers from the vacuum environment of the front wall vacuum transfer module 148 to the controlled environment of the EFEM 100 or vice versa. Exemplary embodiments of a cluster processing tools including load locks, a vacuum transfer modules, processing modules, and associated robots can be found in commonly-assigned U.S. Pat. Nos. 6,321,134 and 7,682,462, which are hereby incorporated by reference in its entirety.

The back wall 121 of the EFEM 100 includes a first back wall wafer port 170. The first back wall wafer port 170 is adapted to be in operational relationship with a back wall cluster processing tool 190. The back wall cluster processing tool 190 can include a back wall transfer module 198 having a controlled environment therein, such as a controlled environment of filtered air or an inert gas such as nitrogen, wherein the transfer module 198 is in operational relationship with one or more back wall processing modules 205. The at least one robot in the enclosure of the EFEM 100 is operable to transfer wafers through the back wall wafer port 170 to the controlled environment of the back wall transfer module 198 wherein the back wall transfer module 198 is operable to transfer wafers to one or more back wall processing modules 205 wherein one or more process operations may be performed on the respective wafer. In an embodiment, the at least one robot can include a linear robot which is operable to move wafers along an extended length path (see FIG. 4) through the first back wall wafer port 170 to the back wall transfer module 198 to transfer wafers to and from back wall processing modules 205 of the back wall cluster processing tool 190.

The front wall processing modules 200 and the back wall processing modules 205 can perform processing operations on wafers such wafer etching, material deposition, and wafer cleaning operations which include operations such as plasma etching, atomic layer etching (ALE), physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, resist removal, in-situ metrology, dry cleaning, wet wafer cleaning, ion beam etching (IBE), and wet-etching (e.g., chemical etch). In an embodiment, the front wall processing modules 200 preferably perform material deposition operations on wafers and/or wafer etching operations while the back wall processing modules 205 perform wafer cleaning operations on the wafer such as a wet cleaning operations. In an embodiment, the front wall cluster processing tool 160 can include up to six front wall processing modules 200, such as three, four, five, or six front wall processing modules 200 and the back wall cluster processing tool can include up to sixteen back wall processing modules 205. Thus, embodiments of the EFEM 100 which are operable to transfer wafers to and from the front wall cluster processing tool 160 and the back wall cluster processing tool 190 without removing the wafer from the controlled environment of the wafer processing system 10 allow for a number of processing modules 200 and 205 to be arranged in operational relationship thereby allowing several process steps or operations to be executed locally in a single wafer processing system 10, thereby increasing utilization of the wafer processing system 10, increasing throughput of the wafer processing system 10, and reducing cycle time of a wafer being processed as a plurality of process operations can be performed on a wafer in the wafer processing system 10 without having to transfer the wafer to a separate distinct wafer processing system 10 for further processing operations.

Figure 2:
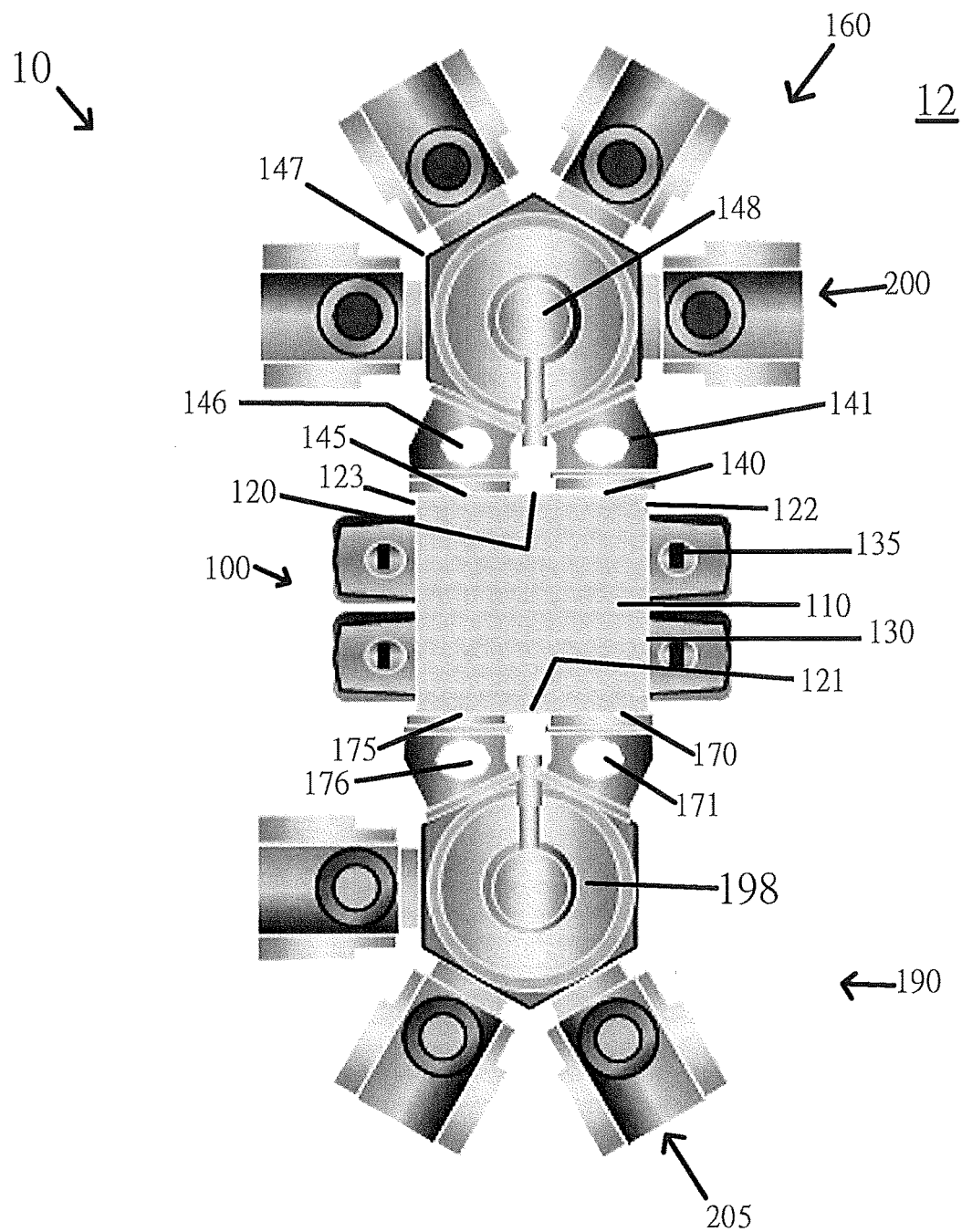
FIG. 2 shows a wafer processing system according to embodiments disclosed herein.

In an embodiment, the back wall transfer module of the back wall cluster processing tool can be a back wall vacuum transfer module. In this embodiment, the first back wall wafer port of the EFEM can be attached to a respective first back wall load lock which is operable to allow a wafer to be transferred from the controlled environment of the EFEM to the vacuum environment of the back wall cluster processing tool or from the vacuum environment of the back wall cluster processing tool to the controlled environment of the EFEM. For example, FIG. 2 illustrates a wafer processing system 10 wherein the EFEM 100 includes a first back wall wafer port 170 and a second back wall wafer port 175. The first and second back wall wafer ports 170, 175 can each attach to respective first and second back wall load locks 171, 176 that are operable to allow a wafer to be transferred from the controlled environment of the EFEM 100 to a vacuum environment of a back wall vacuum transfer module 198 of the back wall cluster processing tool 190 or from the vacuum environment of the back wall vacuum transfer module 198 of the back wall cluster processing tool 190 to the controlled environment of the EFEM 100.

At least one robot (not shown) in the enclosure of the EFEM 100 is operable to transfer wafers from a FOUP 135 attached to a respective wafer load port 130 to the first or second back wall load lock 171, 176. The first and/or second back wall load locks 171, 176 can include a vacuum pump (not shown) in fluid communication therewith such that the vacuum pump may reduce the pressure in the respective load lock 171, 176 so as to allow the wafer to be subsequently transferred to the back wall vacuum transfer module 198. A vacuum transfer robot (not shown) of the back wall vacuum transfer module 198 is operable to transfer the wafer from the respective first or second back wall load lock 171, 176 to one or more back wall processing modules 205 of the back wall cluster processing tool 190 wherein one or more process operations can be performed on the respective wafer in respective back wall processing module 205 such as a material deposition or plasma etching operation.

After the one or more process operations have been performed on the wafer, the wafer may be transferred back through the first or second back wall load lock 171, 176 by the vacuum transfer robot of the back wall vacuum transfer module 198, wherein the pressure in the interior of the respective back wall load lock 171, 176 may be increased such that the at least one robot of the EFEM 100 may transfer the wafer from the respective first or second back wall load lock 171, 176 back to the controlled environment of the EFEM 100. In a preferred embodiment, the first back wall load lock 171 can be dedicated to transferring wafers from the controlled environment of the EFEM 100 to the vacuum environment of the back wall vacuum transfer module 198 while the second back wall load lock 176 is dedicated to transferring wafers from the vacuum environment of the back wall vacuum transfer module 198 to the controlled environment of the EFEM 100 or vice versa.

In an embodiment, the front wall load locks 141, 146 and/or the back wall load locks 171, 176 can be stacked load locks such as those disclosed in commonly-assigned U.S. Pat. No. 8,430,620, which is hereby incorporated by reference herein in its entirety. If the load locks are stacked, the stacked load locks may be in operational relationship with respective stacked wafer ports of the EFEM 100. In a further embodiment, the front wall load locks 141, 146 and/or the back wall load locks 171, 176 can be operable to perform a processing operation on a wafer disposed therein.

Figure 3B:
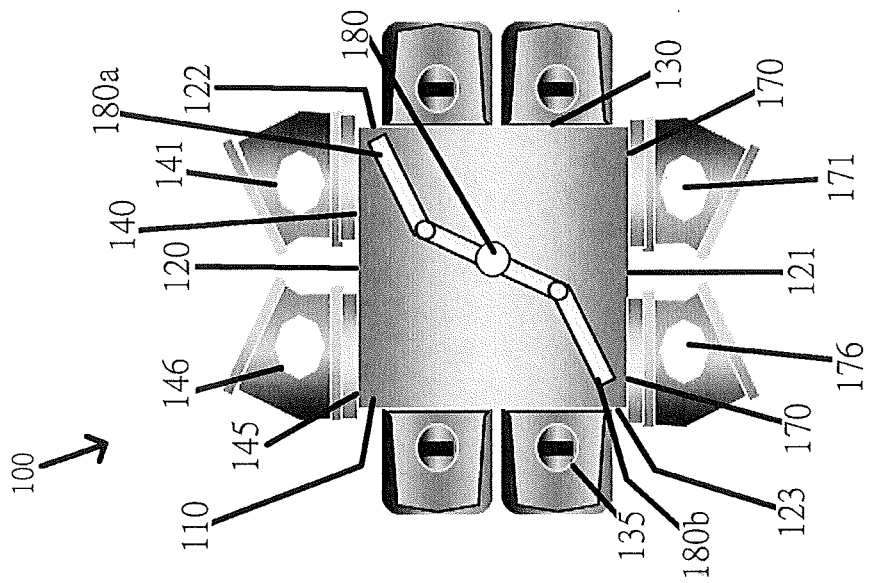
FIGS. 3A-C show EFEMs of a wafer processing systems according to embodiments disclosed herein.
Figure 3A:
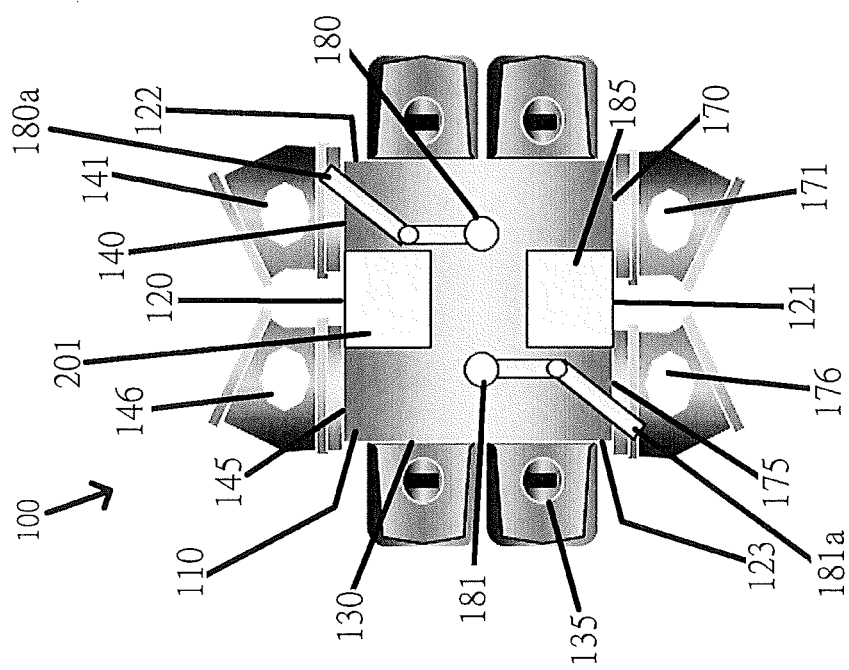

Referring to FIG. 3A, the at least one robot of the EFEM 100 can include a first robot 180 and a second robot 181 in the enclosure 110 thereof. The first robot 180 can have an arm 180a and the second robot 181 can have an arm 181a. The end of arm 180a of the first robot 180 and the end of arm 181a of the second robot 181 can each include an end effector, or alternatively dual end effectors. An end effector is a device or tool connected to the end of a robot arm, for example, a blade, paddle or gripper, which is operable to support a semiconductor wafer while the robot arm transfers the semiconductor wafer. As used herein, the end effector is any such support or device that physically contacts the wafer or other substrate to transport it. End effectors include generally flat supports, such as blades, paddles or forks, on which a wafer may sit, as well as devices that hold the wafer in place, such as a gripper. Exemplary embodiments of robot arms including end effectors, such as dual end effectors, or end effectors dedicated to transfer either hot or cold wafers (or processed or unprocessed wafers) can be found in commonly-assigned U.S. Pat. No. 8,430,620.

In an embodiment, the first robot 180 can be operable to remove and transfer wafers to and from one or more FOUPs 135 attached to respective wafer load ports 130 located on the first side wall 122 of the EFEM 100 while the second robot 181 can be operable to remove and transfer wafers to and from one or more FOUPs 135 attached to respective wafer load ports 130 located on the second side wall 123 of the EFEM 100. In an embodiment the first robot 180 can be dedicated to removing wafers from a FOUP 135 attached to a wafer load port 130 and the second robot 181 can be dedicated to store wafers in a FOUP 135 attached to a respective wafer load port 130. In this embodiment, the first robot 180 may be dedicated to transferring unprocessed wafers while the second robot 181 is dedicated to transferring processed wafers. In an alternate embodiment, the first robot 180 can be dedicated to transferring wafers through the first or second front wall wafer ports 140, 145 while the second robot 181 is dedicated to transferring wafers through the first or second back wall wafer ports 170, 175.

In an embodiment, the EFEM 100 can include a wafer storage section 185 in the enclosure 110 thereof. The wafer storage section 185 is operable to store processed or unprocessed wafers wherein the first robot 180 and/or the second robot 181 can be operable to transfer wafers to or from the wafer storage section. In an embodiment, the EFEM 100 can include a wafer aligner 201 in the enclosure 110 thereof. The first robot 180 and/or the second robot 181 can be operable to transfer a wafer to and from the wafer aligner 201 wherein the wafer aligner 201 is operable to provide wafer movement in a rotational direction and a linear radial direction such that the wafer may be centered before the wafer is transferred to a processing module (not shown) of the front wall cluster processing tool (not shown) or the back wall cluster processing tool (not shown). Exemplary embodiments of a wafer aligner can be found in commonly-assigned U.S. Pat. No. 8,185,242 which is hereby incorporated by reference herein in its entirety.

Referring now to FIG. 3B, the EFEM 100 can include a first robot 180 in the interior 110 thereof wherein the first robot 180 can have dual arms 180a and 180b. The dual arms 180a and 180b can each have an end effector at a respective end thereof, or alternatively dual end effectors at respective ends thereof. The dual arms 180a and 180b of the first robot 180 can be operable to remove and transfer wafers to or from one or more FOUPs 135 attached to respective wafer load ports 130 located on either the first side wall 122 of the EFEM 100 or the second side wall 123 of the EFEM 100. In an alternate embodiment, the arm 180a of the first robot 180 can be dedicated to remove and transfer wafers to or from one or more FOUPs 135 attached to respective wafer load ports 130 located on the first side wall 122 of the EFEM 100 while the arm 180b of the first robot 180 can be dedicated to remove and transfer wafers to and from one or more FOUPs 135 attached to respective wafer load ports 130 located on the second side wall 123 of the EFEM 100.

Figure 3C:
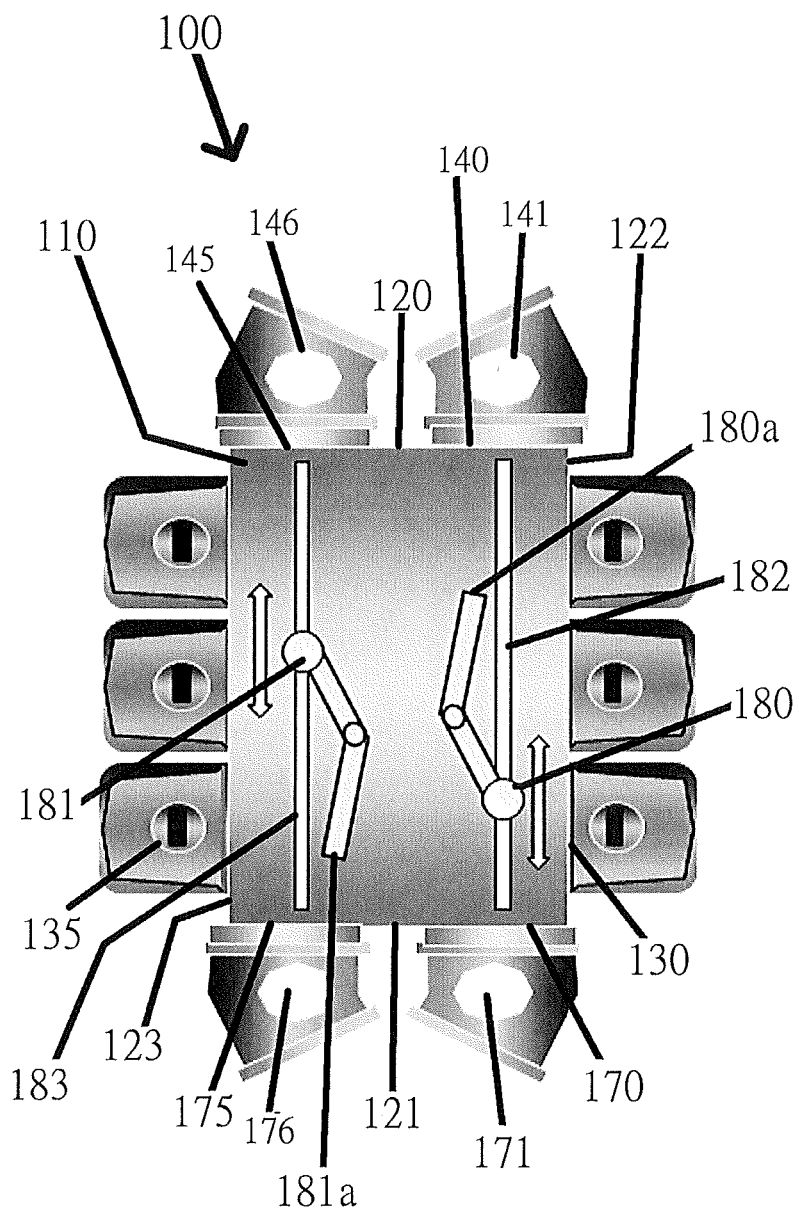

In an embodiment, the at least one robot of the EFEM 100 can include a linear robot operable to move wafers along a travel path extending between the front wall 120 and the back wall 121, or alternatively along a travel path extending between the first side wall 122 and the second side wall 123. For example, as illustrated in FIG. 3C, the EFEM 100 can include a first linear robot 180 and a second linear robot 181 wherein the first linear robot 180 is movable along a first travel path 182 between the front wall 120 and the back wall 121 and the second linear robot 181 is movable along a second travel path 183 between the front wall 120 and the back wall 121. In an alternative embodiment, the first linear robot 180 and/or the second linear robot 181 are movable along respective travel paths between the first side wall 122 and the second side wall 123.

Figure 4:
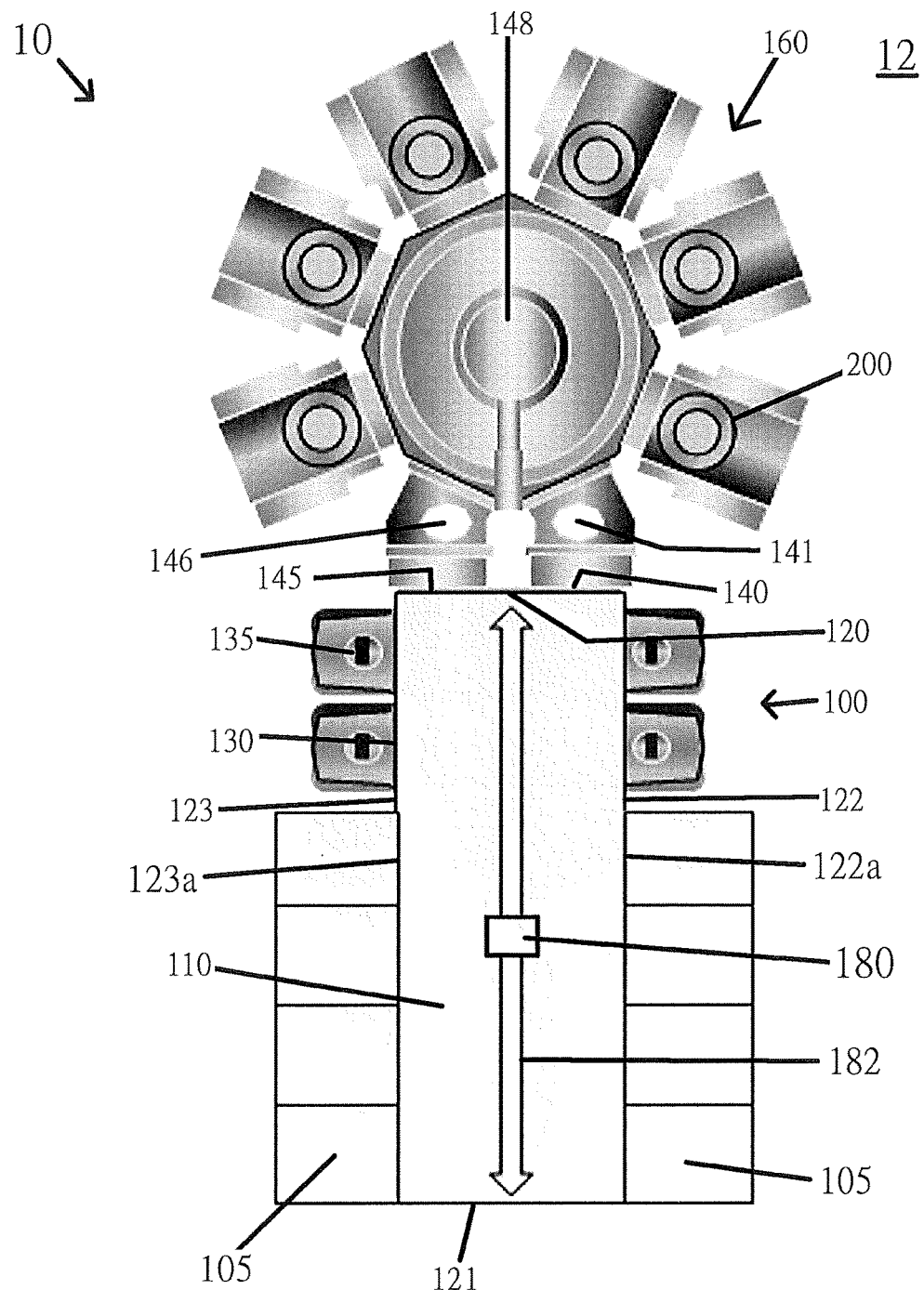
FIG. 4 shows a wafer processing system according to embodiments disclosed herein.

FIG. 4 illustrates a wafer processing system 10 according to embodiments disclosed herein. The wafer processing system 10 includes an EFEM 100 useful for transferring semiconductor wafers to and from processing modules in operational relationship therewith wherein one or more process operations are performed on a respective wafer. The EFEM 100 includes an enclosure 110 having a controlled environment therein wherein the enclosure 110 is bounded by a front wall 120, a back wall 121, a first side wall 122 between the front wall 120 and the back wall 121, a second side wall 123 between the front wall 120 and the back wall 121, a top wall (not shown), and a bottom wall (not shown). The first side wall, the second side wall, the top wall, or the bottom wall can include two or more wafer load ports 130 wherein each wafer load port 130 is adapted to receive a FOUP 135 from an overhead wafer transfer system (not shown) configured to transfer a FOUP 135 to a respective wafer load port 130 of the EFEM 100. For example, as shown in FIG. 4, the first side wall 122 of the EFEM 100 includes two wafer load ports 130 and the second side wall 123 of the EFEM 100 includes two wafer load ports 130.

The front wall of the EFEM 100 includes a first front wall wafer port 140 and a second front wall wafer port 145. The first and second front wall wafer ports 140, 145 can attach to respective first and second front wall load locks 141, 146 which are operable to allow a wafer to be transferred from the controlled environment of the EFEM 100 to a vacuum environment of a front wall vacuum transfer module 148 of a front wall cluster processing tool 160 or from the vacuum environment of the front wall vacuum transfer module 148 of the front wall cluster processing tool 160 to the controlled environment of the EFEM 100. The first side wall 122 of the EFEM 100 includes at least two first side wall wafer ports 122a and the second side wall 123 includes at least two second side wall wafer ports 123a. The at least two first side wall wafer ports 122a and the at least two second side wall wafer ports 123a can each attach to a respective EFEM semiconductor wafer processing module (EFEM processing module) 105 which can be operable to perform a wet wafer cleaning operation for example. An exemplary embodiment of a wet wafer clean operation can be found in commonly assigned U.S. Pat. No. 8,388,762, which is hereby incorporated by reference herein in its entirety.

Figure 7:
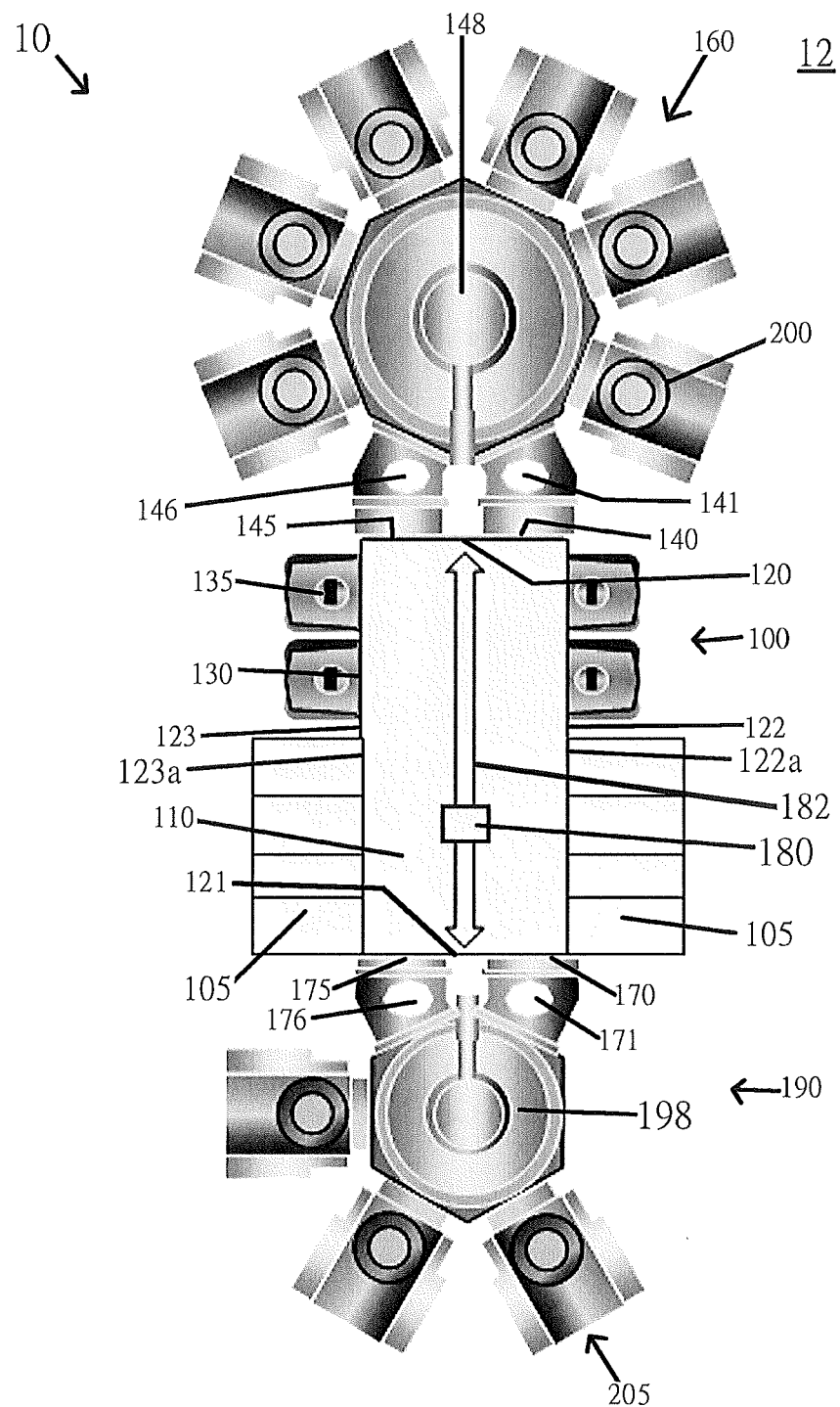
FIG. 7 shows a wafer processing system according to embodiments disclosed herein.

The EFEM 100 includes at least one robot in the enclosure 110 thereof, such as linear robot 180 operable to transfer wafers through the wafer load ports 130, the first front wall wafer port 140, the second front wall wafer port 145, the at least two first side wall wafer ports 122a, and the at least two second side wall wafer ports 123a. For example, as shown in FIG. 4 the EFEM 100 includes four first side wall wafer ports 122a each directly attached to respective EFEM processing modules 105 and four second side wall wafer ports 123a each directly attached to respective EFEM processing modules 105 wherein the linear robot 180 can travel on a travel path 182 such that the linear robot can transfer wafers through the four first side wall wafer ports 122a the four second side wall wafer ports 123a, the wafer load ports 130, the first front wall wafer port 140, the second front wall wafer port 145, and optional first and/or second back wall wafer ports 170, 175. If the EFEM 100 includes the optional back wall wafer ports 170, 175, the back wall wafer ports 170, 175 can be in operational relationship with a back wall cluster processing tool 190 as illustrated in FIG. 7. The first and second back wall wafer ports 170, 175 can each attach to respective first and second back wall load locks 171, 176 that are operable to allow a wafer to be transferred from the controlled environment of the EFEM 100 to a vacuum environment of a back wall vacuum transfer module 198 of the back wall cluster processing tool 190 or from the vacuum environment of the back wall vacuum transfer module 198 of the back wall cluster processing tool 190 to the controlled environment of the EFEM 100. In alternate embodiments, referring to FIG. 4 or 7, the first and second side walls 122, 123 can each include up to eight respective side wall wafer ports 122a, 123a each operable to attach to a respective EFEM processing module 105. Further, in an embodiment, two or more wafer ports 122a, 123a may be associated with a respective EFEM processing module 105. For example, two or more wafer ports 122a, 123a can be stacked in two or more rows wherein each stack is associated with a respective EFEM processing module 105, or two or more wafer ports 122a, 123a which are side by side may be associated with a respective EFEM processing module 105.

Figure 5:
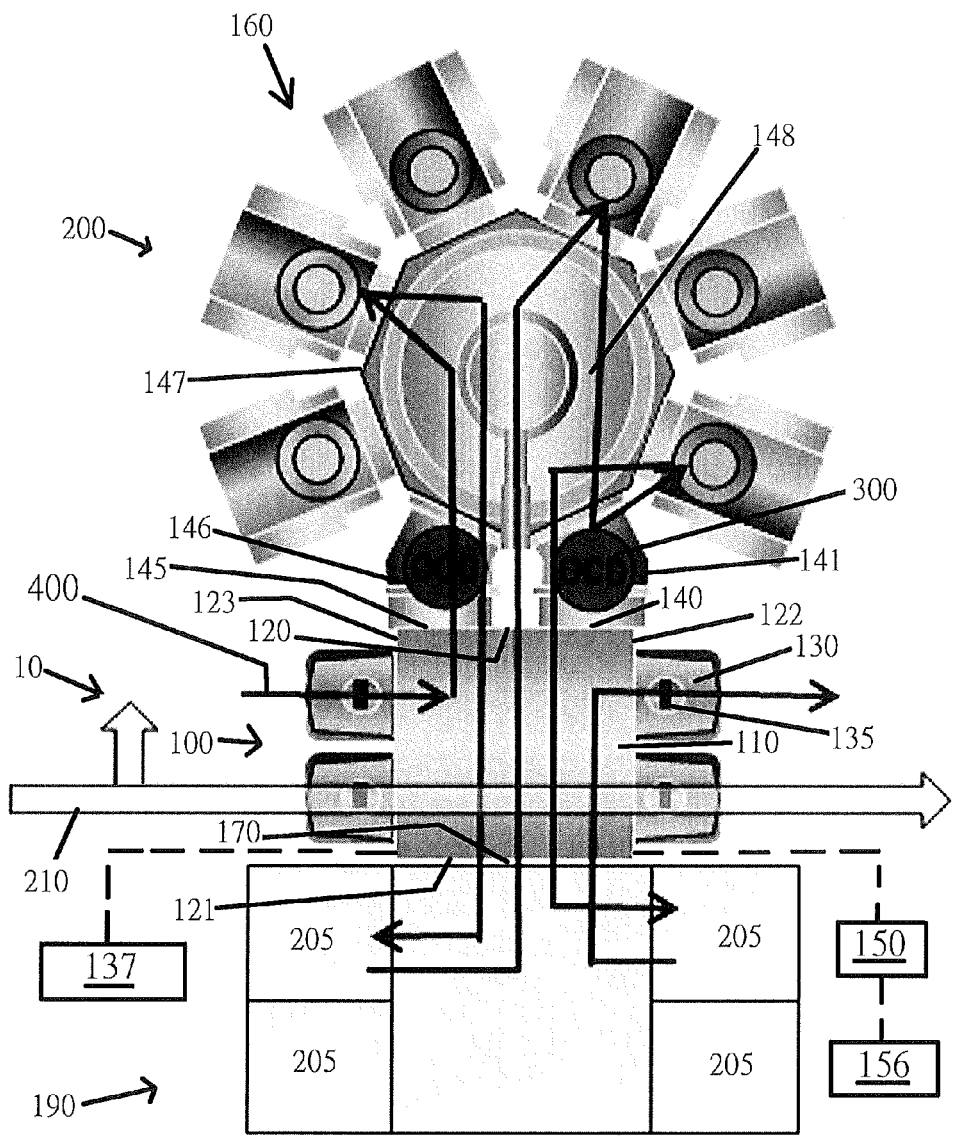
FIG. 5 shows a wafer processing system according to embodiments disclosed herein.

In an embodiment of a wafer processing system 10 as illustrated in FIG. 5, an overhead wafer transfer (OHT) system 210 is operable to transfer a FOUP 135 to a wafer port 130 of the EFEM 100. The OHT system 210 is operable to raise, lower, and rotate the FOUP 135 such that the FOUP 135 may be aligned with a respective wafer load port 130 of the EFEM 100 such that wafers may be removed from the FOUP 135 by the at least one robot of the EFEM 100. Preferably, the height of the EFEM 100 is dimensioned such that the OHT system 210 can transfer a FOUP 135 over the top wall of the EFEM 100 between the front wall 120 and the back wall 121 of the EFEM 100.

The EFEM 100 can include an electronics enclosure 150 operable to power the EFEM 100, and a fan filter unit 137 operable to provide filtered air to the controlled environment of the enclosure 110 of the EFEM 100. An exemplary embodiment of an EFEM including a fan filter unit and electronics enclosure 150 can be found in commonly assigned U.S. Pat. No. 8,282,698, which is hereby incorporated by reference herein in its entirety. In an embodiment, a load lock attached to a wafer port of the EFEM 100, such as the first and/or second front wall load locks 141, 146 can include an optical critical dimension metrology tool 300 therein such that features of the wafer, including but not limited to wafer bow or the thickness (topology) of a film on the wafer, can be measured before or after a wafer has been transferred to the front wall cluster processing tool 160. Alternatively, a first and/or second back wall load lock 171, 176 (see FIG. 2) can include an optical critical dimension metrology tool 300 therein for measuring features of a wafer including but not limited to critical dimension or film thickness measurements on the wafer. Exemplary embodiments of optical critical dimension metrology tools can be found in commonly-assigned U.S. Pat. Nos. 7,309,618 and 8,225,683, which are hereby incorporated by reference herein in their entirety.

The wafer processing systems 10 and related EFEMs 100 disclosed herein may be integrated with electronics for controlling their operation before, during, and after processing of a semiconductor wafer or substrate. The electronics may be referred to as the "controller," which may control various components or subparts of the system or systems. For example, as illustrated in FIG. 5 the wafer processing system 10 and/or the EFEM 100 includes an electronics enclosure 150 and an associated controller 156. The controller 156, depending on the processing requirements and/or the type of wafer processing system 10, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 156, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 156 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level (i.e. wafer processing system 10) or as part of a remote computer) that combine to control a process on the chamber.

Without limitation, example wafer processing systems 10 may include processing chambers including a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing apparatuses or systems that may be associated or used in the fabrication and/or manufacturing of semiconductor wafers.

As noted above, depending on the process step or steps to be performed by the wafer processing system 10, the controller 156 of the EFEM 100 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. Preferably, a non-transitory computer machine-readable medium includes program instructions for control of the wafer processing system 10.

FIG. 5 illustrates a path of a wafer being processed in a wafer processing system 10. Preferably the controller 156 includes wafer transfer instructions designating the path a wafer will take (i.e. wafer transfer instructions) throughout the wafer processing system 10. An exemplary embodiment of a computer-implemented method for creating a set of wafer transfer instructions for a wafer processing system can be found in commonly-assigned U.S. Pat. No. 7,680,559, which is hereby incorporated herein by reference in its entirety.

The method of processing a wafer in the wafer processing system 10 can include transferring a FOUP 135 of wafers to a wafer load port 130 of the EFEM 100. The wafer may then be transferred from the FOUP 135 to a controlled environment of the EFEM 100 by the at least one robot of the EFEM. The at least one robot may then transfer the wafer from the controlled environment of the EFEM 100 to a vacuum environment of the front wall cluster processing tool 160 through the first or second front wall wafer port 140, 141 wherein the wafer undergoes one or more processing operations, such as material deposition or plasma etching, in one or more processing modules of the front wall cluster processing tool 160. For example, the wafer may be transferred to a respective first or second front wall load lock 141, 146 wherein an optical critical dimension metrology tool 300 can measure features of the wafer while the respective load lock 141, 145 reduces the pressure environment of the wafer, such that the wafer may subsequently be transferred to the front wall vacuum transfer module 148 of the front wall cluster processing tool 160 wherein one or more process operations are performed in respective processing modules 200 in operational relationship therewith.

The wafer may then be transferred from the front wall cluster processing tool 160 to the controlled environment of the EFEM 100 through a first or second front wall wafer port 140, 145 of the EFEM 100. The wafer may then be transferred by the at least one robot of the EFEM 100 to the back wall cluster processing tool 190 through the first back wall wafer port 170 of the EFEM 100 wherein the wafer undergoes one or more processing operations, such as a cleaning operation in one or more back wall processing modules 205 of the back wall cluster processing tool 190. After the wafer has been processed by one or more back wall processing modules 205 of the back wall cluster processing tool 190 the wafer may be transferred from the back wall cluster processing tool 190 to the controlled environment of the EFEM 100 through the first back wall wafer port 170 of the EFEM 100. During processing, the wafer may be transferred back and forth through the EFEM between the front wall cluster processing tool 160 and the back wall cluster processing tool 190 one or more times. After processing, the wafer may then be returned to a FOUP 135 attached to a respective wafer port 130 of the EFEM 100 such that the wafer may be removed from the wafer processing system 10.

Figure 6:
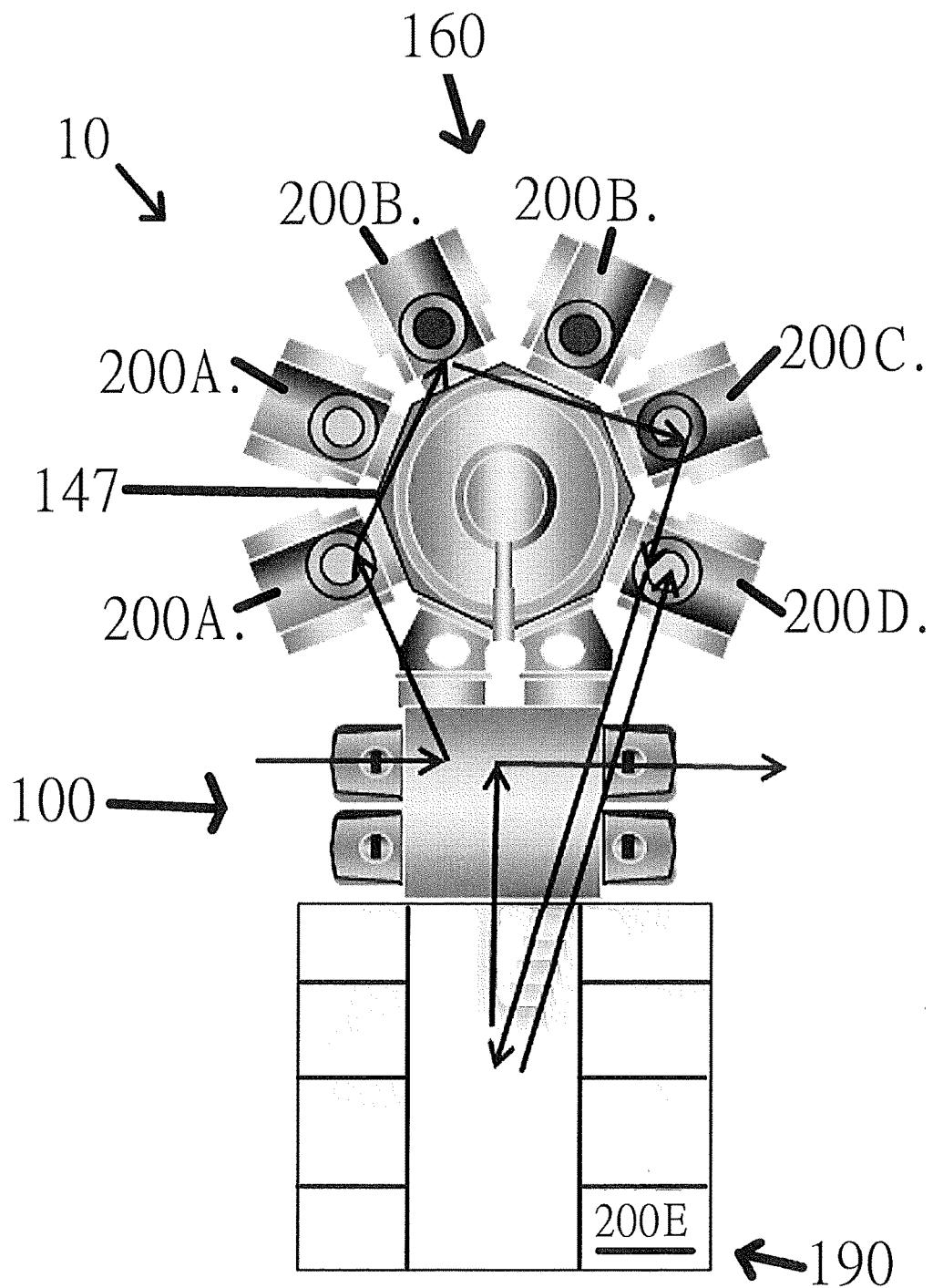
FIG. 6 shows a wafer processing system according to embodiments disclosed herein.

FIG. 6 illustrates an embodiment of processing operations which may be performed on a semiconductor wafer in a wafer processing system 10. The processing operations can include transferring a wafer from a FOUP through the EFEM 100 to a first front wall processing module 200A of the front wall cluster processing tool 160 wherein the wafer undergoes, for example, a mask opening operation. Next, the wafer may be transferred to a second front wall processing module 200B wherein, for example, an ion beam etching (IBE) process is performed on the wafer. The wafer may then be transferred to a third front wall processing module 200C wherein, for example, a spacer layer may be deposited on the wafer. The wafer may then be transferred to a fourth front wall processing module 200D wherein, for example, an atomic layer etch activation operation may be performed. After the atomic layer etch activation has been performed the wafer may be transferred through the EFEM 100 to the back wall cluster processing tool 190 such that a back wall processing module 205 may perform an atomic layer etching operation to remove material from the wafer. The wafer may be subsequently transferred back and forth through the EFEM 100 between the front wall processing module 200D and the back wall processing module 205 such that atomic layer etch activation and atomic layer etching operations may be performed until a desired amount of material has been removed from the wafer. After the desired amount of material has been removed from the wafer, the wafer may be transferred from the EFEM to a respective FOUP wherein the wafer can be removed from the wafer processing system 10.

Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the embodiments as disclosed herein are not to be limited to the details given herein, but may be modified within the scope and equivalents of the appended claims.

What is claimed:

1. An equipment front end module (EFEM) useful for transferring semiconductor wafers to and from semiconductor wafer processing modules comprising:
an enclosure that is bounded by a front wall, a back wall, first and second side walls between the front wall and the back wall, a top wall, and a bottom wall and that is adapted to provide a single controlled environment throughout the enclosure;
the first side wall or the second side wall including two or more wafer load ports wherein each wafer load port is adapted to receive a front opening unified pod (FOUP) from a wafer transfer system configured to transfer a FOUP to a respective wafer load port;
the front wall including a first front wall wafer port and a second front wall wafer port, the first and second front wall wafer ports configured to attach to respective first and second front wall load locks operable to allow a wafer to be transferred from the controlled environment of the EFEM to a vacuum environment of a front wall cluster processing tool or from the vacuum environment of the front wall cluster processing tool to the controlled environment of the EFEM;
the back wall including a first back wall wafer port, the back wall wafer port adapted to be in operational relationship with a back wall cluster processing tool; and
at least one robot in the enclosure of the EFEM operable to transfer wafers through the wafer load ports, the first front wall wafer port, the second front wall wafer port, and the back wall wafer port.

2. The EFEM of claim 1, wherein:
(a) the first back wall wafer port is attached to a respective first back wall load lock, the first back wall load lock operable to allow a wafer to be transferred from the controlled environment of the EFEM to a vacuum environment of the back wall cluster processing tool or from the vacuum environment of the back wall cluster processing tool to the controlled environment of the EFEM;
(b) the back wall includes a second back wall wafer port, the first and the second back wall wafer ports configured to attach to respective first and second back wall load locks operable to allow a wafer to be transferred from the controlled environment of the EFEM to a vacuum environment of the back wall cluster processing tool or from the vacuum environment of the back wall cluster processing tool to the controlled environment of the EFEM; or (c) the back wall includes a second back wall wafer port, the first and the second back wall wafer ports attached to respective first and second back wall load locks operable to allow a wafer to be transferred from the controlled environment of the EFEM to a vacuum environment of the back wall cluster processing tool or from the vacuum environment of the back wall cluster processing tool to the controlled environment of the EFEM.

3. The EFEM of claim 1, wherein the EFEM includes:
(a) a wafer storage section in the enclosure thereof, the wafer storage section operable to store processed or unprocessed wafers, the at least one robot operable to transfer wafers to or from the wafer storage section;
(b) a wafer aligner in the enclosure thereof, the at least one robot operable to transfer a wafer to and from the wafer aligner wherein the wafer aligner is operable to provide wafer movement in a rotational direction and a linear radial direction such that the wafer may be centered before the wafer is transferred to a processing module of the front wall cluster processing tool or the back wall cluster processing tool;
(c) a fan filter unit operable to provide filtered air to the controlled environment of the EFEM; and/or
(d) an electronics enclosure including electronics to power the EFEM.

4. The EFEM of claim 1, wherein:
(a) the EFEM is attached to the back wall cluster processing tool and the at least one robot is operable to transfer wafers from the controlled environment of the EFEM through the first back wall wafer port to a controlled environment of back wall cluster processing tool and from the controlled environment of the back wall cluster processing tool through the first back wall wafer port to the controlled environment of the EFEM;
(b) the EFEM is attached to the back wall cluster processing tool and the at least one robot includes a linear robot, the linear robot is operable to move wafers along an extended length path extending through the first back wall wafer port and transfer wafers to and from processing modules of the back wall cluster processing tool;
(c) the at least one robot includes a first robot operable to remove wafers from a first FOUP attached to a wafer load port and a second robot operable to store wafers in a second FOUP attached to a wafer load port;
(d) the at least one robot is movable along a travel path between the first side wall and the second side wall; and/or
(e) the at least one robot is movable along a travel path between the front wall and the back wall.

5. An equipment front end module (EFEM) useful for transferring semiconductor wafers to and from processing modules comprising:
an enclosure that is bounded by a front wall, a back wall, first and second side walls between the front wall and the back wall, a top wall, and a bottom wall and that is adapted to provide a single controlled environment throughout the enclosure;
the first side wall or the second side wall including two or more wafer load ports wherein each wafer load port is adapted to receive a front opening unified pod (FOUP) from a wafer transfer system configured to transfer a FOUP to a respective wafer load port;
the front wall including a first front wall wafer port and a second front wall wafer port, the first and second front wall wafer ports configured to attach to respective first and second front wall load locks operable to allow a wafer to be transferred from the controlled environment of the EFEM to a vacuum environment of a front wall cluster processing tool or from the vacuum environment of the front wall cluster processing tool to the controlled environment of the EFEM;
the first side wall including at least two first side wall wafer ports and the second side wall including at least two second side wall wafer ports, the at least two first side wall wafer ports and the at least two second side wall wafer ports each configured to attach to a respective semiconductor wafer processing module; and
at least one robot in the enclosure of the EFEM operable to transfer wafers through the wafer load ports, the first front wall wafer port, the second front wall wafer port, the at least two first side wall wafer ports, and the at least two second side wall wafer ports.

6. The EFEM of claim 5, wherein:
(a) the back wall includes a first back wall wafer port adapted to be in operational relationship with a back wall cluster processing tool wherein the at least one robot in the enclosure of the EFEM is operable to transfer wafers through the first back wall wafer port;
(b) the back wall includes a first back wall wafer port adapted to be in operational relationship with a back wall cluster processing tool, the first back wall wafer port attached to a respective first back wall load lock, the first back wall load lock operable to allow a wafer to be transferred from the controlled environment of the EFEM to a vacuum environment of the back wall cluster processing tool or from the vacuum environment of the back wall cluster processing tool to the controlled environment of the EFEM wherein the at least one robot in the enclosure of the EFEM is operable to transfer wafers through the first back wall wafer port;
(c) the back wall includes first and second back wall wafer ports adapted to be in operational relationship with a back wall cluster processing tool, the first and the second back wall wafer ports configured to attach to respective first and second back wall load locks operable to allow a wafer to be transferred from the controlled environment of the EFEM to a controlled environment of the back wall cluster processing tool or from the vacuum environment of the back wall cluster processing tool to the controlled environment of the EFEM wherein the at least one robot in the enclosure of the EFEM is operable to transfer wafers through the first and second back wall wafer ports; or
(d) the back wall includes first and second back wall wafer ports adapted to be in operational relationship with a back wall cluster processing tool, the first and the second back wall wafer ports attached to respective first and second back wall load locks operable to allow a wafer to be transferred from the controlled environment of the EFEM to a controlled environment of the back wall cluster processing tool or from the controlled environment of the back wall cluster processing tool to the controlled environment of the EFEM wherein the at least one robot in the enclosure of the EFEM is operable to transfer wafers through the first and second back wall wafer ports.

7. The EFEM of claim 5, wherein:
(a) the at least one robot includes a linear robot, the linear robot operable to move wafers along an extended length path in the enclosure of the EFEM and transfer wafers through the first side wall wafer ports and the second side wall wafer ports;
(b) the EFEM includes a wafer storage section in the enclosure thereof, the wafer storage section operable to store processed or unprocessed wafers, the at least one robot operable to transfer wafers to or from the wafer storage section;
(c) the at least one robot includes a first robot adapted to remove wafers from a first FOUP attached to a wafer load port and a second robot operable to store wafers in a second FOUP attached to a wafer load port;
(d) the at least one robot is movable along a travel path between the first side wall and the second side wall;
(e) the at least one robot is movable along a travel path between the front wall and the back wall;
(f) the EFEM includes a wafer aligner in the enclosure thereof, the at least one robot operable to transfer a wafer to and from the wafer aligner wherein the wafer aligner is operable to provide wafer movement in a rotational direction and a linear radial direction such that the wafer may be centered before the wafer is transferred to a processing module of the front wall cluster processing tool or a respective semiconductor wafer processing module attached to the first or second side wall wafer ports;
(g) the EFEM includes a fan filter unit operable to provide filtered air to the controlled environment of the EFEM; and/or
(h) a respective semiconductor wafer processing module is attached to at least a respective one of the at least two first side wall wafer ports and the at least two second side wall wafer ports.

8. A wafer processing system comprising the EFEM of claim 1, wherein the first front wall wafer port and the second front wall wafer port are each attached to the respective first and second front wall load locks operable to allow a wafer to be transferred from the controlled environment of the EFEM to the vacuum environment of the front wall cluster processing tool or from the vacuum environment of the front wall cluster processing tool to the controlled environment of the EFEM.

9. The wafer processing system of claim 8, wherein:
(a) the first back wall wafer port is in operational relationship with a respective first back wall load lock, the first back wall load lock operable to allow a wafer to be transferred from the controlled environment of the EFEM to a vacuum environment of the back wall cluster processing tool;
(b) the back wall includes a second back wall wafer port, the first and the second back wall wafer ports are in operational relationship with respective first and second back wall load locks, the first and second back wall load locks each operable to allow a wafer to be transferred from the controlled environment of the EFEM to a vacuum environment of the back wall cluster processing tool and from the vacuum environment of the back wall cluster processing tool to the controlled environment of the EFEM; or
(c) the EFEM is attached to the back wall cluster processing tool and the at least one robot is operable to transfer wafers from the controlled environment of the EFEM through the first back wall wafer port to a controlled environment of back wall cluster processing tool and from the controlled environment of the back wall cluster processing tool through the first back wall wafer port to the controlled environment of the EFEM.

10. The wafer processing system of claim 8, wherein the EFEM includes:
(a) two or more wafer load ports in the first side wall and two or more wafer load ports in the second side wall;
(b) a wafer storage section in the enclosure thereof operable to store processed or unprocessed wafers therein, the at least one robot operable to transfer wafers to or from the wafer storage section;
(c) a wafer aligner in the enclosure thereof, the at least one robot operable to transfer a wafer to and from the wafer aligner wherein the wafer aligner is operable to provide wafer movement in a rotational direction and a linear radial direction such that the wafer may be centered before the wafer is transferred to a process module of the front wall cluster processing tool or the back wall cluster processing tool;
(d) a fan filter unit operable to provide filtered air to the controlled environment of the EFEM; and/or
(e) an electronics enclosure including electronics to power the EFEM.

11. The wafer processing system of claim 8, wherein:
(a) the back wall cluster processing tool includes an extended length path and a linear robot in a transfer module thereof, the linear robot operable to move wafers along the extended length path and transfer wafers to and from processing modules of the back wall cluster processing tool; and/or
(b) one of: the front wall cluster processing tool includes a front wall vacuum transfer module and one or more process modules in operational relationship with the vacuum transfer module and the back wall cluster processing tool includes a back wall transfer module having a controlled environment therein and one or more process modules in operational relationship with the back wall transfer module; or the front wall cluster processing tool includes a front wall vacuum transfer module and one or more process modules in operational relationship with the vacuum transfer module and the back wall cluster processing tool includes a back wall transfer module having a controlled environment therein and one or more process modules in operational relationship with the back wall transfer module.

12. The wafer processing system of claim 8, further comprising:
(a) a controller configured to control processes performed by the system;
(b) a non-transitory computer machine-readable medium comprising program instructions for control of the system;
(c) an overhead wafer transfer (OHT) system wherein the height of the EFEM is dimensioned such that the OHT system can transfer a FOUP over the top wall of the EFEM between the front wall and back wall of the EFEM; the OHT system operable to raise, lower, and rotate the FOUP such that the FOUP may be aligned with a respective wafer load port of the EFEM; and/or
(d) an optical critical dimension metrology tool included in the first or second front wall load lock.

13. A wafer processing system comprising the EFEM of claim 5, wherein the first front wall wafer port and the second front wall wafer port are each attached to the respective first and second front wall load locks operable to allow a wafer to be transferred from the controlled environment of the EFEM to the vacuum environment of the front wall cluster processing tool or from the vacuum environment of the front wall cluster processing tool to the controlled environment of the EFEM.

14. The wafer processing system of claim 13, wherein:
   (a) the at least one robot includes a linear robot, the linear robot operable to move wafers along an extended length path in the enclosure of the EFEM and transfer wafers through the first side wall wafer ports and the second side wall wafer ports;
   (b) the EFEM includes a wafer storage section in the enclosure thereof, the wafer storage section operable to store processed or unprocessed wafers, the at least one robot operable to transfer wafers to or from the wafer storage section;
   (c) the at least one robot includes a first robot adapted to remove wafers from a first FOUP attached to a wafer load port and a second robot operable to store wafers in a second FOUP attached to a wafer load port;
   (d) the at least one robot is movable along a travel path between the first side wall and the second side wall;
   (e) the at least one robot is movable along a travel path between the front wall and the back wall;
   (f) the EFEM includes a wafer aligner in the enclosure thereof, the at least one robot operable to transfer a wafer to and from the wafer aligner wherein the wafer aligner is operable to provide wafer movement in a rotational direction and a linear radial direction such that the wafer may be centered before the wafer is transferred to a processing module of the front wall cluster processing tool or a respective semiconductor wafer processing module attached to the first or second side wall wafer ports;
   (g) the EFEM includes a fan filter unit operable to provide filtered air to the controlled environment of the EFEM; and/or
   (h) a respective semiconductor wafer processing module is attached to at least a respective one of the at least two first side wall wafer ports and the at least two second side wall wafer ports.

15. The wafer processing system of claim 13, further comprising:
   (a) a controller configured to control processes performed by the system;
   (b) a non-transitory computer machine-readable medium comprising program instructions for control of the system;
   (c) an overhead wafer transfer (OHT) system wherein the height of the EFEM is dimensioned such that the OHT system can transfer a FOUP over the top wall of the EFEM between the front wall and back wall of the EFEM; the OHT system operable to raise, lower, and rotate the FOUP such that the FOUP may be aligned with a respective wafer load port of the EFEM; and/or
   (d) an optical critical dimension metrology tool included in the first or second front wall load lock.

16. A method of processing a wafer in the system of claim 8, the method comprising:
   (a) transferring a wafer from a FOUP to the controlled environment of the EFEM;
   (b) transferring the wafer from the controlled environment of the EFEM to the vacuum environment of the front wall cluster processing tool through the first or second front wall wafer port wherein the wafer undergoes one or more processing operations in one or more processing modules of the front wall cluster processing tool;
   (c) transferring the wafer from the front wall cluster processing tool to the controlled environment of the EFEM through the first or second front wall wafer port of the EFEM;
   (d) transferring the wafer to the back wall cluster processing tool through the first back wall wafer port of the EFEM wherein the wafer undergoes one or more processing operations in one or more processing modules of the back wall cluster processing tool;
   (e) transferring the wafer from the back wall cluster processing tool to the controlled environment of the EFEM through the first back wall wafer port of the EFEM; and
   wherein steps (b)-(e) are performed one or more times.

17. The method of claim 16, further comprising:
   (a) transferring the wafer to a wafer storage section of the EFEM;
   (b) transferring the wafer to a wafer aligner and centering a wafer thereon;
   (c) performing an optical critical dimension metrology process on a wafer in the first or second front wall load lock while transferring the wafer from the controlled environment of the EFEM to the vacuum environment of the front wall cluster processing tool; and/or
   (e) transferring the wafer from the controlled environment of the EFEM to a FOUP received at a wafer load port of the EFEM.

18. A method of processing a wafer in the system of claim 13, the method comprising:
   (a) transferring a wafer from a FOUP to a controlled environment of the EFEM;
   (b) transferring the wafer from the controlled environment of the EFEM to a vacuum environment of the front wall cluster processing tool through the first or second front wall wafer port wherein the wafer undergoes one or more processing operations in one or more processing modules of the front wall cluster processing tool;
   (c) transferring the wafer from the front wall cluster processing tool to the controlled environment of the EFEM through the first or second front wall wafer port of the EFEM;
   (d) transferring the wafer through one of the at least two first side wall wafer ports or the at least two second side wall wafer ports to a respective processing module thereof wherein a processing operation is performed therein;
   (e) transferring the wafer back to the controlled environment of the EFEM; and
   wherein steps (b)-(e) are performed one or more times, and/or the steps (d)-(e) are performed one or more times.

19. The method of claim 18, further comprising:
   (a) transferring the wafer to a wafer storage section of the EFEM;
   (b) transferring the wafer to a wafer aligner and centering a wafer thereon;
   (c) performing an optical critical dimension metrology process on a wafer in the first or second front wall load lock while transferring the wafer from the controlled environment of the EFEM to the vacuum environment of the front wall cluster processing tool; and/or
   (e) transferring the wafer from the controlled environment of the EFEM to a FOUP received at a wafer load port of the EFEM.

* * * * *